United States Patent
Hattendorf et al.

(10) Patent No.: US 7,858,981 B2
(45) Date of Patent: Dec. 28, 2010

(54) STRAINED NMOS TRANSISTOR FEATURING DEEP CARBON DOPED REGIONS AND RAISED DONOR DOPED SOURCE AND DRAIN

(75) Inventors: Michael L. Hattendorf, Beaverton, OR (US); Jack Hwang, Portland, OR (US); Anand Murthy, Portland, OR (US); Andrew N. Westmeyer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 160 days.

(21) Appl. No.: 12/319,887

(22) Filed: Jan. 12, 2009

(65) Prior Publication Data

US 2009/0152601 A1   Jun. 18, 2009

Related U.S. Application Data

(62) Division of application No. 11/014,937, filed on Dec. 17, 2004, now Pat. No. 7,479,431.

(51) Int. Cl.
*H01L 29/04* (2006.01)
*H01L 31/036* (2006.01)

(52) U.S. Cl. .................. 257/51; 257/E29.267

(58) Field of Classification Search ............ 257/51, 257/65, E29.131, E29.267
See application file for complete search history.

(56) References Cited

U.S. PATENT DOCUMENTS

| | | | |
|---|---|---|---|
| 5,756,391 A * | 5/1998 | Tsuchiaki | |
| 5,967,794 A * | 10/1999 | Kodama | |
| 6,303,450 B1 * | 10/2001 | Park et al. | |
| 6,492,216 B1 * | 12/2002 | Yeo et al. | |
| 6,512,252 B1 * | 1/2003 | Takagi et al. | |
| 6,605,498 B1 * | 8/2003 | Murthy et al. | |
| 6,608,354 B2 * | 8/2003 | Hokazono et al. | |
| 2001/0025998 A1 * | 10/2001 | Tsuchiaki | |
| 2002/0033511 A1 * | 3/2002 | Babcock et al. | |
| 2002/0125479 A1 * | 9/2002 | Lippert et al. | |
| 2003/0080361 A1 * | 5/2003 | Murthy et al. | |
| 2004/0197969 A1 * | 10/2004 | Chen et al. | |
| 2004/0262694 B1 * | 12/2004 | Chidambaram | |
| 2006/0003561 A1 * | 1/2006 | Goktepeli | 438/528 |
| 2006/0060893 A1 * | 3/2006 | Chakravarthi et al. | 257/269 |

FOREIGN PATENT DOCUMENTS

JP    10-050989 A    2/1998

* cited by examiner

*Primary Examiner*—W. David Coleman
(74) *Attorney, Agent, or Firm*—Kenneth A. Nelson

(57) ABSTRACT

Some embodiments of the present invention include providing carbon doped regions and raised source/drain regions to provide tensile stress in NMOS transistor channels.

26 Claims, 3 Drawing Sheets

US 7,858,981 B2

STRAINED NMOS TRANSISTOR FEATURING DEEP CARBON DOPED REGIONS AND RAISED DONOR DOPED SOURCE AND DRAIN

CLAIM OF PRIORITY

This application is a divisional of U.S. patent application Ser. No. 11/014,937 which was filed on Dec. 17, 2004 and is scheduled to issue as U.S. Pat. No. 7,479,431 on Jan. 20, 2009.

TECHNICAL FIELD

Embodiments of the invention relate to semiconductor technology. In particular, embodiments of the invention relate to methods and apparatus for NMOS transistor optimization.

BACKGROUND

In semiconductor processing, transistors may be formed on semiconductor wafers. The transistors may include a gate structure, a source, a drain, and a channel region and may be NMOS (N Channel Metal Oxide Semiconductor) or PMOS (P Channel Metal Oxide Semiconductor) transistors. The transistors and other devices may be interconnected to form integrated circuits (ICs). The ICs may then be packaged and sold. The performance of the ICs may depend on the performance of the transistors.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, an apparatus and method relating to strained NMOS transistors are described. In the following description, various embodiments will be described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn. However, the order of description should not be construed as to imply that these operations are necessarily order dependent. In particular, these operations need not be performed in the order of presentation.

Transistor performance may be enhanced by providing stress to transistor channels. For example, NMOS (N Channel Metal Oxide Semiconductor) transistor performance may improve when the channel of the NMOS transistor is under lateral tensile stress. Lateral tensile stress in the NMOS channel may stretch the silicon lattice in the channel and allow electrons to move more easily from the source to the drain, thus improving drive current in the NMOS transistors.

Figure 1:
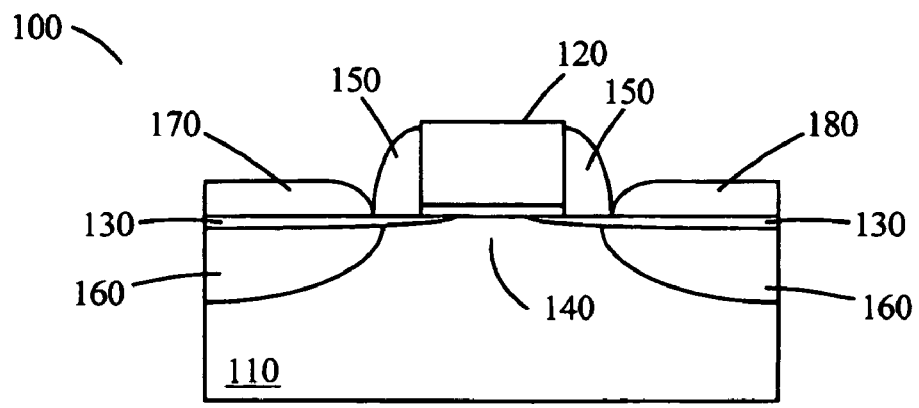
FIG. 1 illustrates a cross sectional type view of an apparatus in accordance with one embodiment of the present invention.

FIG. 1 illustrates a cross-sectional type view of an NMOS transistor 100. NMOS transistor 100 includes a substrate 110, a gate structure 120 (including a gate electrode and gate dielectric, as further discussed below), source and drain tip regions 130, a strained channel 140, spacers 150, substitutional carbon regions 160, a raised source structure 170, and a raised drain structure 180. Substrate 110 may include monocrystalline silicon or other materials as further discussed below. Substitutional carbon regions 160 may include a material lattice mostly comprising silicon, but including carbon atoms substituted in place of silicon atoms at some sites in the lattice structure. The substitutional carbon atoms in the lattice may have shorter bond lengths than silicon atoms in the lattice. As a result, substitutional carbon regions 160 may be under a stress as compared to a lattice of only silicon atoms. Substitutional carbon regions 160 may transmit this stress on adjacent lattice structures and, in particular, may cause a uniaxial lateral tensile stress in strained channel 140.

The tensile stress in strained channel 140 may improve the performance of NMOS transistor 100 by stretching the silicon lattice in the strained channel 140 and thereby increasing the mobility of electrons in strained channel 140 and increasing drive current. In general, the larger the fraction of substitutional carbon and greater volume of substitutional carbon regions 160, the greater the stress provided on strained channel 140. In one embodiment, the percentage of carbon in substitutional carbon regions 160 may be in the range of about 0.1 to 5.0%. In another embodiment, the percentage of carbon in substitutional carbon regions 160 may be in the range of about 0.5 to 3.0%.

Raised source structure 170 and raised drain structure 180 may be adjacent to substitutional carbon regions 160 and source and drain tip regions 130 such that the dopants in raised source structure 170 and raised drain structure 180 may be separate from substitutional carbon regions 160. Raised source structure 170 and raised drain structure 180 may provide low resistance contact or access to strained channel 140.

Figure 2A:
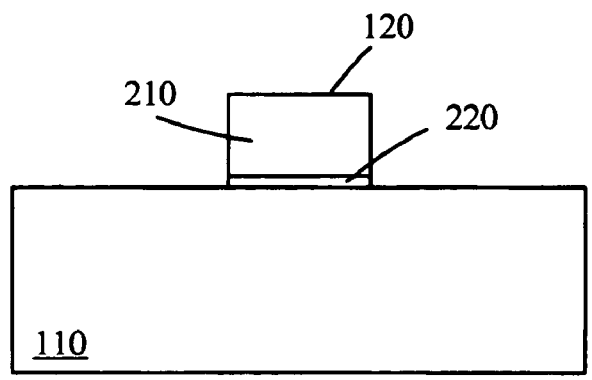
FIGS. 2A-2F illustrate cross sectional type views of a method in accordance with one embodiment of the present invention.

FIGS. 2A-2E illustrate a method according to an embodiment of the invention. Referring first to FIG. 2A, gate structure 120 may be formed on substrate 110 by known methods. Substrate 110 may be a wafer or a die and may include monocrystalline silicon, silicon on insulator, or other suitable materials. Substrate 110 may also include other layers or structures (not shown) that comprise insulative, conductive or semiconductive materials. Substrate 110 may be doped with a p-type dopant (for example, boron) in NMOS transistor regions such that NMOS transistor 100 is built in a p-well region.

Further, FIG. 2A illustrates only a portion of substrate 110 having a single NMOS transistor 100 for the sake of clarity. Substrate 110 may include numerous additional NMOS transistors, PMOS (P Channel Metal Oxide Semiconductor) transistors (not illustrated), and other devices (not illustrated). PMOS transistors and other devices may be covered by photoresist or a patterned dielectric layer by known methods during NMOS transistor processing.

Gate structure 120 may include a gate electrode 210 and a gate dielectric 220. In one embodiment, gate dielectric 220 may be an insulative material. In another embodiment, gate dielectric 220 may include a high-k material. In one embodiment, gate electrode 210 may include polysilicon. In another embodiment, gate electrode 210 may include a pre-doped polysilicon. In yet another embodiment, gate electrode 210 may include a metal.

Figure 2B:
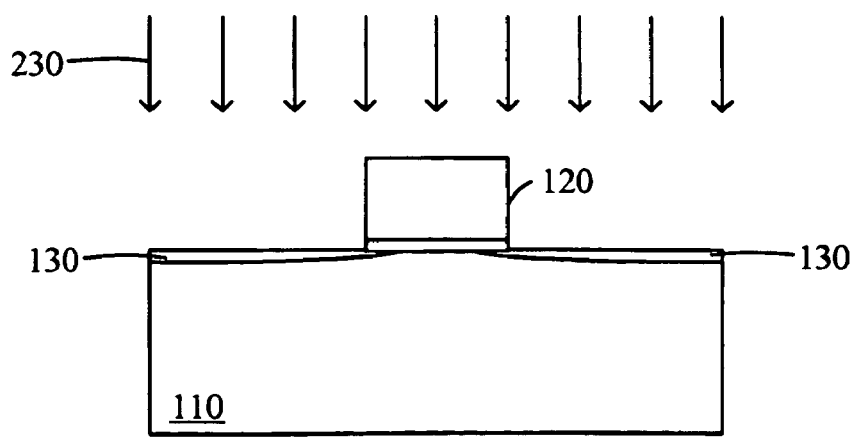

In FIG. 2B, a tip implant 230 may be performed to form source and drain tip regions 130. Tip implant 230 may include any n-type dopant. In some embodiments, tip implant 230 may include phosphorous or arsenic. The source and drain tip regions 130 may be shallow relative to other implants and tip implant 230 may be performed using a low energy implant. Source and drain tip regions 130 may be implanted into the surface of substrate 110 that is adjacent to gate structure 120 such that source and drain tip regions 130 may self align to gate structure 120.

In an embodiment, tip implant 230 may also implant gate structure 120. After tip implant 230, the dopants may be aligned with the edges of gate structure 120. An anneal may be performed and source and drain tip regions 130 may diffuse slightly under gate structure 120. In other embodiments, tip implant 230 may be performed at an angle such that the implant extends under gate structure 120.

Figure 2C:
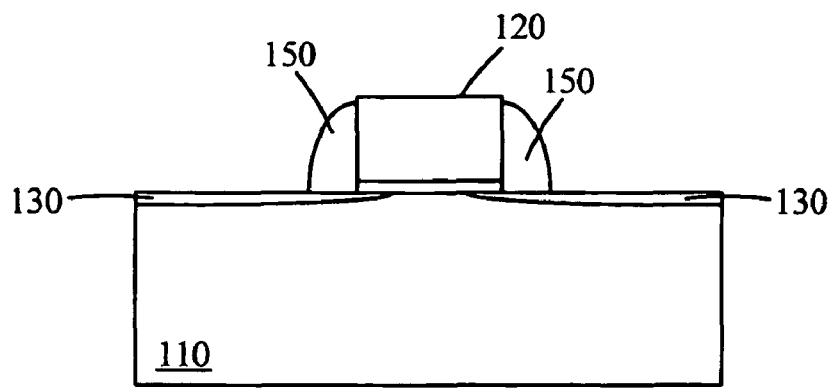

Referring now to FIG. 2C, spacers 150 may be formed adjacent to gate structure 120. Spacers 150 may include oxide or nitride and may be formed by known methods such as deposition and spacer etch. In some embodiments, spacers 150 may be narrow spacers, having widths in the range of about 5 nm to 35 nm. In other embodiments, spacers 150 may not be formed prior to the steps illustrated in FIGS. 2D and 2E, but may be formed later or not at all, as is further discussed below in reference to FIG. 2E.

Figure 2D:
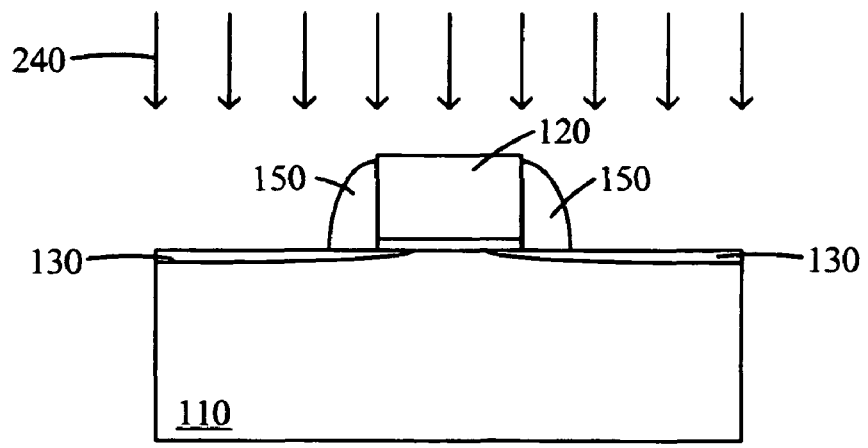
Figure 2E:
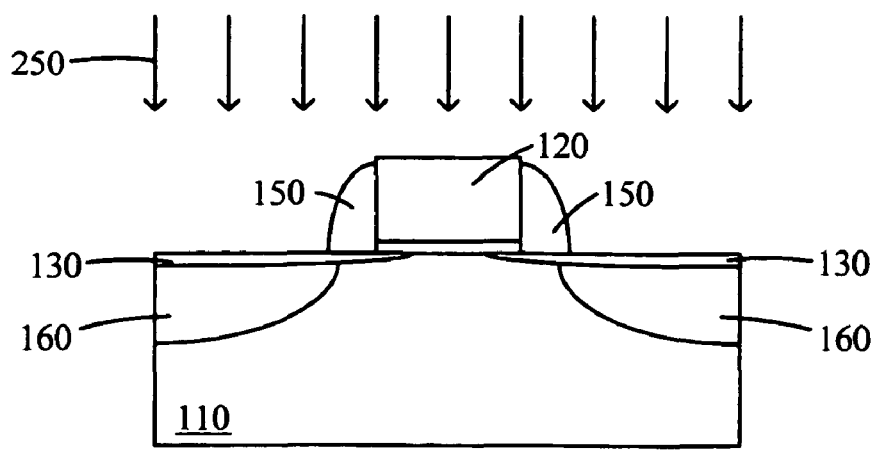

In FIG. 2D an amorphization implant 240 may be performed to disturb the crystal lattice structure of substrate 110. Amorphization implant 240 may include any electrically neutral implant species. In one embodiment, amorphization implant 240 may include silicon. In another embodiment, amorphization implant 240 may include germanium. In FIG. 2E, carbon may be implanted into substrate 110 by a carbon implant 250. In one embodiment, carbon implant 250 may be at an energy in the range of about 5 keV to 15 keV. In another embodiment, carbon implant 250 may be at an energy in the range of about 8 keV to 12 keV. In yet other embodiments, carbon implant 250 may be at a dose in the range of about 1 E14/cm$^2$ and 1E16/cm$^2$. In another embodiment, carbon implant 250 may be at a dose in the range of about 4E15/cm$^2$ to 6E15/cm$^2$. In other embodiments, multiple carbon implants of varying energy may be used to achieve a desired carbon distribution in substrate 110.

In some embodiments, the amorphization implant or carbon implant may be accompanied by a low-dose donor implant to suppress junction leakage. In one embodiment, the donor may be phosphorous. In another embodiment, the donor implant may be at a dose in the range of about 1E13/cm$^2$ and 1E15/cm$^2$ and at an energy in the range of about 15 keV to 45 keV. In one embodiment, a donor implant of phosphorous at an energy of about 30 keV and a dose of about 1 E14/cm$^2$ may be used.

An anneal may be performed to re-crystallize the lattice, including carbon in the largely silicon lattice, to form substitutional carbon regions 160. In one embodiment, the anneal may be a spike anneal at a temperature above about 900° C. In another embodiment, the anneal may be a sub-melt laser anneal. In one embodiment, the sub-melt anneal may be a flash anneal.

Although the method is illustrated by showing sequentially amorphization implant 240, carbon implant 250, and then anneal, the order is not meant to be limiting. In particular, any method where the carbon is present and the lattice structure has been disturbed prior to anneal may be available. In one embodiment, carbon implant 250 may come before amorphization implant 240 and an anneal may follow. Other processing flows and orders, for example: carbon implant, anneal, amorphization implant, anneal, may be available.

As discussed with respect to FIG. 2C, spacers 150 may not have been formed prior to the steps illustrated in FIGS. 2D and 2E. In such embodiments, substitutional carbon regions 160 may not have an offset from gate structure 120 due to spacers 150, but may instead align to the edges of gate structure.

Figure 2F:
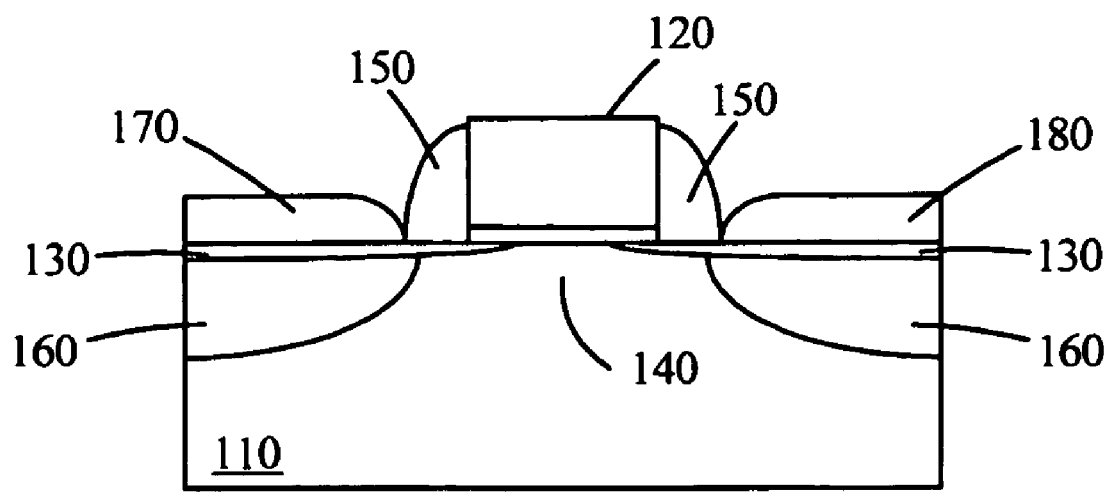

Referring now to FIG. 2F, raised source structure 170 and raised drain structure 180 may be formed. Raised source structure 170 and raised drain structure 180 may comprise silicon. In an embodiment, raised source structure 170 and raised drain structure 180 may be formed by selective epitaxy. In one embodiment, raised source structure 170 and raised drain structure 180 may be formed using chemical vapor deposition (CVD). Raised source structure 170 and raised drain structure 180 may include a dopant such as phosphorous or arsenic. In one embodiment, the dopant may be provided during epitaxial growth or by implant. The dopant concentration may be in the range of about 1.0E20/cm$^3$ to 8.0E20/cm$^3$.

Subsequently, raised source structure 170 and raised drain structure 180 may be silicided (not shown) to provide lower resistance electrical connection to electrical contact materials as is known in the art. In particular, raised source structure 170 and raised drain structure 180 may be sufficiently thick such that the metal-semiconductor alloy formed during silicide is separate from substitutional carbon regions 160.

The order of description of the above method should not be considered limiting, methods may use the described operations out of order or with omissions or additions, for example, a "disposable spacer" method may be used. In such an embodiment, the spacers may first be formed adjacent to the gate structure and the spacers may be used to offset the substitutional carbon regions and raised source and drain during implant. The spacers may then be removed and a tip implant may be performed. Other variations may be available.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A semiconductor apparatus comprising:
  a gate structure atop a substrate;
  a raised drain structure atop the substrate;
  a raised source structure atop the substrate;
  a region comprising carbon and silicon below a surface of the substrate and below the raised drain structure;
  a channel region; and a tip implant region below the surface of the substrate and below the raised drain structure, wherein a bottom of the region comprising carbon and silicon is below a bottom of the tip implant region.

2. The apparatus of claim 1, further comprising:
a second region comprising carbon and silicon below the surface of the substrate and below the raised source structure.

3. The apparatus of claim 1, wherein the region comprising carbon and silicon comprises a substantially monocrystalline silicon lattice having about 0.1 to 5.0% carbon.

4. The apparatus of claim 1, wherein the region comprising carbon and silicon comprises a substantially monocrystalline silicon lattice having about 0.5 to 3.0% carbon.

5. The apparatus of claim 1, wherein the tip implant region comprises at least one of phosphorous or arsenic.

6. The apparatus of claim 1, further comprising:
a spacer atop the substrate, the spacer being adjacent to the gate structure.

7. The apparatus of claim 1, wherein the raised source structure and the raised drain structure comprise at least one of phosphorous or arsenic.

8. The apparatus of claim 1, wherein the raised source structure and the raised drain structure comprise a dopant having a concentration in the range of about $1.0E20/cm^3$ to $8.0E20/cm^3$.

9. The apparatus of claim 1, wherein the gate structure includes a gate electrode and a gate dielectric, the gate electrode comprising at least one of polysilicon or metal.

10. The apparatus of claim 6, wherein the raised drain structure is adjacent to the spacer.

11. The apparatus of claim 10, wherein the tip implant region extends under at least a portion of the spacer.

12. The apparatus of claim 10, wherein the tip implant region extends under a portion of the gate structure.

13. The apparatus of claim 10, wherein the region comprising carbon and silicon is substantially aligned with a surface of the spacer opposite the gate structure.

14. The apparatus of claim 10, wherein the region comprising carbon and silicon extends under a portion of the spacer.

15. An apparatus comprising:
a region comprising carbon and silicon below a substrate surface;
a raised drain structure above the substrate surface and above the region comprising carbon and silicon;
a tip implant region below the substrate surface and below the raised drain structure, wherein a bottom of the region comprising carbon and silicon is below a bottom of the tip implant region.

16. The apparatus of claim 15, further comprising:
a second region comprising carbon and silicon below the substrate surface; and
a raised source structure above the substrate surface and above the second region comprising carbon and silicon.

17. The apparatus of claim 15, wherein the region comprising carbon and silicon comprises a substantially monocrystalline silicon lattice having about 0.5 to 3.0% carbon.

18. The apparatus of claim 15, wherein the raised drain structure includes a dopant, the dopant comprising at least one of phosphorous or arsenic.

19. The apparatus of claim 16, further comprising:
a gate atop the substrate surface;
a second tip implant region below the substrate surface and below the raised source structure; and
a first spacer and second spacer, the first and second spacers being adjacent to the gate.

20. The apparatus of claim 19, wherein the first spacer and the second spacers are about 5 to 35 nm in width.

21. An apparatus comprising:
a gate structure atop a substrate;
a first spacer on the substrate and adjacent to the gate structure;
a raised source structure on the substrate and adjacent to the first spacer;
a second spacer on the substrate and adjacent to the gate structure;
a raised drain structure on the substrate and adjacent to the second spacer;
a first tip implant region below the substrate surface and below the raised source structure;
a second tip implant region below the substrate surface and below the raised drain structure;
a first region comprising carbon and silicon below the substrate surface and below the raised source structure; and
a second region comprising carbon and silicon below the substrate surface and below the raised drain structure, wherein a bottom of the first region comprising carbon and silicon is below a bottom of the first tip implant region and a bottom of the second region comprising carbon and silicon is below a bottom of the second tip implant region.

22. The apparatus of claim 21, wherein the first region comprising carbon and silicon comprises a substantially monocrystalline silicon lattice having about 0.1 to 5.0% of carbon.

23. The apparatus of claim 21, wherein the first region comprising carbon and silicon comprises a substantially monocrystalline silicon lattice having about 0.5 to 3.0% of carbon.

24. The apparatus of claim 21, wherein the first tip implant region extends under at least a portion of the gate structure.

25. The apparatus of claim 21, wherein the first region comprising carbon and silicon extends under at least a portion of the first spacer.

26. A semiconductor apparatus comprising:
a substrate comprising silicon, the substrate having a top surface;
a gate structure atop the top surface of the substrate, the gate structure having sidewalls;
first and second spacers on the sidewalls of the gate structure;
a source region beneath the top surface of the substrate, on a first side of the gate structure;
a drain region beneath the top surface of the substrate, on a second side of the gate structure;
a first raised silicon-containing region atop the source and adjacent the first spacer;
a second raised silicon-containing region atop the drain and adjacent the second spacer;
a carbon-containing region below the substrate surface and below at least one of the drain region and the source region;
a channel region; and
a tip implant region below the substrate surface and below at least one of the drain region and the source region, wherein the bottom of the carbon-containing region is below the bottom of the tip implant region.

* * * * *